United States Patent
Okamoto et al.

(10) Patent No.: US 6,593,642 B2
(45) Date of Patent: Jul. 15, 2003

(54) SEMICONDUCTOR DEVICE PROVIDED WITH POTENTIAL TRANSMISSION LINE

(75) Inventors: Mako Okamoto, Hyogo (JP); Yasuhiko Taito, Hyogo (JP); Fukashi Morishita, Hyogo (JP); Akira Yamazaki, Hyogo (JP); Nobuyuki Fujii, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/987,257

(22) Filed: Nov. 14, 2001

(65) Prior Publication Data

US 2003/0025181 A1 Feb. 6, 2003

(30) Foreign Application Priority Data

Jul. 27, 2001 (JP) .................................. 2001-227670

(51) Int. Cl.$^7$ ................................ G01F 1/10
(52) U.S. Cl. ................. 257/664; 327/111; 327/536
(58) Field of Search .................. 257/664, 202, 257/208; 327/108, 109, 111, 536

(56) References Cited

U.S. PATENT DOCUMENTS 6,404,272 B2 * 6/2002 Zanuccoli et al. .......... 327/536
6,515,520 B2 * 2/2003 Kiyose ....................... 327/108

OTHER PUBLICATIONS

Kiyoo Ito, "Ultra LSI Memory," Nov. 5, 1994, pp. 310–322, Advanced Electronics Series, I–9, Baifukan.

* cited by examiner

*Primary Examiner*—Roy Potter
(74) *Attorney, Agent, or Firm*—McDermott, Will & Emery

(57) ABSTRACT

A DRAM is provided at a portion relating to generation of a boosted potential with a filter circuit located between a detector circuit and a ring oscillator for removing a pulse-like change in level from an output signal of the detector circuit. Accordingly, temporary stop of the charge pump circuit can be prevented even when the boosted potential exceeds in a pulse-like manner the reference potential at the vicinity of the output node of the charge pump circuit, and the boosted potential can be rapidly restored to the reference potential.

6 Claims, 15 Drawing Sheets

SEMICONDUCTOR DEVICE PROVIDED WITH POTENTIAL TRANSMISSION LINE

BACKGROUND OF THE INVENTION

1. Field of the Invention

The present invention relates to a semiconductor device, and particularly a semiconductor device provided with a potential transmission line for transmitting an internal potential to a plurality of load capacitors.

2. Description of the Background Art

FIG. 15 is a circuit block diagram showing a major portion of a Dynamic Random Access Memory, which will be referred to as a "DRAM" hereinafter, in the prior art. In FIG. 15, the DRAM includes a memory array MA, a detector circuit 50, a ring oscillator 51 and a charge pump circuit 52. Memory array MA includes a plurality of memory blocks MB arranged in rows and columns (10 rows and 7 columns in FIG. 15).

Memory block MB includes, as shown in FIG. 16, a plurality of memory cells MC arranged in rows and columns, word lines WL arranged corresponding to the respective memory cell rows, and bit line pairs BL and /BL arranged corresponding to the respective memory cell columns. Each memory cell MC includes an N-channel MOS transistor 53 and a capacitor 54. N-channel MOS transistor 53 is connected between corresponding bit line BL or /BL and a storage node SN, and has a gate connected to corresponding word line WL. Capacitor 54 is connected between storage node SN and a line bearing a cell plate potential.

In a write operation, word line WL in the row corresponding to the row address signal is raised to a boosted potential VPP sufficiently higher than a power supply potential VCC, and N-channel MOS transistor 53 of memory cell MC, which is connected to the above word line WL, is turned on. Then, bit line pair BL and /BL in the column corresponding to the column address signal is selected, and one bit line (e.g., BL) in selected bit line pair BL and /BL is set to power supply potential VCC in accordance with write data signal. The other bit line (e.g., /BL) is set to ground potential GND. Thereby, the potential on bit line BL or /BL is written onto storage node SN of memory cell MC.

In a read operation, each bit line pair BL and /BL is set to a bit line precharge potential VBL equal to VCC/2, and then word line WL on the row corresponding to the row address signal is raised to boosted potential VPP. Thereby, N-channel MOS transistor 53 of memory cell MC connected to word line WL is turned on, and a minute potential difference occurs between paired bit lines BL and /BL in accordance with the potential on storage node SN of memory cell MC. The minute potential difference between paired bit lines BL and /BL is amplified to the power supply voltage by a sense amplifier (not shown). Then, bit line pair BL and /BL on the column corresponding to the column address signal is selected, and a comparison is made between the potentials on the paired bit lines BL and /B. Thereby, data of a logic corresponding to the result of this comparison is externally output as read data of selected memory cell MC. As described above, word line WL designated by the row address signal is raised to boosted potential VPP. This is performed for the purpose of sufficiently writing power supply potential VCC onto storage node SN of memory cell MC, and sufficiently reading out power supply potential VCC on storage node SN.

FIG. 17 is a cross section schematically showing a structure of memory block MB. In FIG. 17, an N-type bottom well 56 is formed at a surface of a P-type semiconductor substrate 55. Further, P-type well 57 is formed at the surface of N-type bottom well 56. N-channel MOS transistor 53 of memory cell MC is provided with a gate electrode 53g, which is formed on the surface of P-type well 57 with a gate insulating film (not shown) therebetween, and an N-type diffusion layer located on the opposite sides of gate electrode 53g and formed at the surface of P-type well 57. The N-type diffusion layers on the opposite sides of gate electrode 53g form a source 53s and a drain 53d of N-channel MOS transistor 53, respectively.

P-type semiconductor substrate 55, N-type bottom well 56 and P-type well 57 are supplied with ground potential GND, boosted potential VPP and negative potential VBB for applying a reverse bias voltage to a PM junction, respectively. Parasitic capacitors C3 and C4 occur between N-type bottom well 56 and P-type semiconductor substrate 55 and between N-type bottom well 56 and P-type semiconductor substrate 55, respectively.

Referring to FIG. 15, seven power supply lines PL are arranged corresponding to seven columns of memory blocks MB, respectively. One end of each of seven power supply lines PL is connected to corresponding one of seven output nodes of charge pump circuit 52. Each power supply line PL extends across and above ten memory blocks MB, and applies boosted potential VPP to N-type bottom wells 56 of corresponding memory blocks MB. A bottom well capacitor C1 is present between power supply line PL and each memory block MB. Bottom well capacity C1 includes parasitic capacitors C3 and C4 shown in FIG. 17.

Power supply lines PL' are arranged between ten rows of memory blocks MB as well as on the opposite sides of the whole area including the ten rows. Power supply lines PL and PL' are connected together at crossing portions between them. Each output node of charge pump circuit 52 is connected to a decouple capacitor C2. Decouple capacitor C2 is provided for preventing a rapid change in potential VPP on power supply lines PL and PL'. A potential detecting line DL, which has an end connected to detector circuit 50, is disposed between charge pump circuit 52 and memory array MA, and extends across seven power supply lines PL. Potential detecting line DL is connected to the respective power supply lines PL at the crossings between them. Potential detecting line DL has a much lower resistance value than power supply lines PL and PL'. Therefore, potential VPP on a base end (node NA) of power supply line PL is accurately transmitted to detector circuit 50.

Detector circuit 50 determines whether boosted potential VPP has reached a predetermined reference potential VR or not. If boosted potential VPP has not yet reached reference potential VR, detector circuit 50 sets a signal LOW to "H" level, which is an active level. If boosted potential VPP has reached reference potential VR, detector circuit 50 sets signal LOW to "L" level, which is an inactive level. Detector circuit 50 quickly responds to a change in level of boosted potential VPP for rapidly supplying charges when boosted potential VPP lowers below reference potential VR. Ring oscillator 51 issues a clock signal PCLK to charge pump circuit 52 when signal LOW is at the active level of "H". When signal LOW is at the inactive level of "L", ring oscillator 51 does not issue clock signal PCLK.

Charge pump circuit 52 includes, as shown in FIG. 18, a capacitor 58 and N-channel MOS transistors 59 and 60 provided corresponding to each power supply line PL. One of the electrodes of capacitor 58 receives clock signal PCLK from ring oscillator 51, and the other electrode is connected to a node N58. The gate and drain of N-channel MOS transistor 59 are connected to the line bearing power supply potential VCC, and the source thereof is connected to node N58. The gate and drain of N-channel MOS transistor 60 are connected to node N58, and the source thereof is connected to one end of corresponding power supply line PL. Each of N-channel MOS transistors 59 and 60 forms a diode.

While clock signal PCLK is at "L" level, a current flows from the line bearing power supply potential VCC to node N58 through N-channel MOS transistor 59 so that node N58 is charged to a potential of (VCC—Vth), where Vth is a threshold voltage of the N-channel MOS transistor. When clock signal PCLK subsequently rises from "L" level (ground potential GND) to "H" level (power supply potential VCC), the potential on node N58 rises to (2VCC—Vth) as a result of coupling of capacitor 58. Thereby, N-channel MOS transistor 60 is turned on, and boosted potential VPP rises to (2VCC–2Vth) at the most.

The DRAM shown in FIGS. 15–18 operates as follows. If boosted potential VPP is lower than reference potential VR, output signal LOW of detector circuit 50 attains the active level of "H" so that ring oscillator 51 applies clock signal PCLK to charge pump circuit 52. Whenever clock signal PCLK rises from "L" level to "H" level, charge pump circuit 52 supplies a predetermined amount of charges to each power supply line PL so that boosted potential VPP gradually rises.

When boosted potential VPP reaches reference potential VR, output signal LOW of detector circuit 54 attains the inactive level of "L" to deactivate ring oscillator 51 and charge pump circuit 52. Therefore, boosted potential VPP is maintained at reference potential VR.

In the device having memory array MA of a large size, however, the line resistance of each power supply line PL as well as bottom well capacitor C1 are large, and a long delay time is required for transmitting the charges, which are output from charge pump circuit 52, from one end of power supply line PL to the other end.

As shown in FIG. 19, memory array MA consumes boosted potential VPP so that signal LOW attains "H" level, and clock signal PCLK lowers from "L" level to "H" level. In this case, the potential on the base end (node NA) of power supply line PL rapidly rises above reference potential VR, and then immediately lowers to the level lower than reference potential VR. Meanwhile, the potential on the distal end (node NB) of power supply line PL rises slowly in response to the rising edge of clock signal PCLK. Therefore, in spite of the fact that the potential on node NB is lower than reference potential VR, signal LOW changes to "L" level in a pulse-like manner (e.g., exhibits a pulse-like change to "L" level) as a result of sensitive detector circuit 50, and ring oscillator 51 stops while signal LOW is at "L" level. Therefore, a long time is required before boosted potential VPP is restored to reference potential VR.

SUMMARY OF THE INVENTION

Accordingly, a major object of the invention is to provide a semiconductor device, which can rapidly restore an internal potential to a reference potential when the internal potential changed.

A semiconductor device according to the invention includes a potential transmission line for transmitting an internal potential; a plurality of load capacitors dispersed along the potential transmission line, and each configured to receive the internal potential from the potential transmission line; a charge pump circuit for supplying charges to one end of the potential transmission line in synchronization with a clock signal; a potential detecting circuit for determining whether the internal potential at a predetermined position on the potential transmission line has reached a reference potential or not, setting an activation signal to a first level if reached, and setting the activation signal to a second level if not reached; a filter circuit for removing a pulse-like change in level from the activation signal; and a clock generating circuit being activated to issue the clock signal to the charge pump circuit when the activation signal processed by the filter circuit is at the second level. Since the filter circuit removes the pulse-like level change of the activation signal, such a situation can be prevented that the charge pump circuit temporarily stops due to the pulse-like change in level of the activation signal. Accordingly, the internal potential can be rapidly restored to the reference potential even when the internal potential changed.

Further, a semiconductor device of another aspect of the invention includes a potential transmission line for transmitting an internal potential; a plurality of load capacitors dispersed along the potential transmission line, and each configured to receive the internal potential from the potential transmission line; a charge pump circuit for supplying charges to one end of the potential transmission line in synchronization with a clock signal; a potential detecting circuit for detecting whether the internal potential at a predetermined position between two connection nodes formed between the load capacitors on the opposite ends among the plurality of load capacitors and the potential transmission line has reached a reference potential or not, setting an activation signal to a first level if reached, and setting the activation signal to a second level if not reached; and a clock generating circuit being activated to issue the clock signal to the charge pump circuit when the activation signal is at the second level. Accordingly, the internal potential is not monitored on one end of the potential transmission line, but the internal potentials are monitored at the predetermined positions between the two connection nodes formed between the load capacitors on the opposite ends and the potential transmission line. Therefore, such a situation can be prevented that the charge pump circuit temporarily stops due to the pulse-like change in level of the activation signal. Accordingly, the internal potential can be rapidly restored to the reference potential even when the internal potential changed.

Preferably, the semiconductor device further includes a potential detecting line for applying the internal potential at the predetermined position on the potential transmission line to the potential detecting circuit. In this structure, the internal potential at the predetermined position on the potential transmission line can be accurately led to the potential detecting circuit.

A semiconductor device of still another aspect of the invention includes a potential transmission line for transmitting an internal potential; load capacitors being equal in number to a value (M×N) obtained by multiplying a predetermined number of M determined in accordance with a use of the semiconductor device by a predetermined number of N, divided into groups of M in number each including the load capacitors of N in number, dispersed along the potential transmission line and each configured to receive the internal potential from the potential transmission line; first terminals of M in number provided corresponding to the groups of M in number, respectively, each arranged near the corresponding group, and connected to the potential transmission line; a charge pump circuit for supplying charges to one end of the potential transmission line in synchronization with a clock signal; a potential detecting line having one end connected to selected one among the first terminals of M in number; a potential detecting circuit for detecting whether a potential on the other end of the potential detecting line has reached a reference potential or not, setting an activation signal to the first level if reached, and setting the activation signal to a second level if not reached; and a clock generating circuit being activated to issue the clock signal to the charge pump circuit when the activation signal is at the second level. Since the internal potentials can be monitored at positions corresponding to the number (M×N) of the load capacitors, the charges can be efficiently supplied. Accordingly, the internal potential can be rapidly restored to the reference potential even when the internal potential changed.

Preferably, the semiconductor device further includes a second terminal connected to one end of the potential transmission line, and the one end of the potential detecting line is connected to the selected one among the first terminals of M in number or the second terminal. Even if the load capacitors are small in number, the second terminal can be selected so that the changed internal potential can be rapidly restored to the reference potential.

A semiconductor device of yet another aspect of the invention includes a potential transmission line for transmitting an internal potential; a plurality of load capacitors dispersed along the potential transmission line, and each configured to receive the internal potential from the potential transmission line; a charge supply circuit for supplying charges to one end of the potential transmission line; a plurality of potential detecting circuits dispersed along the potential transmission line, each receiving the internal potential from the potential transmission line to determine whether the internal potential has reached a reference potential or not, and each issuing a signal at a level corresponding to the result of the determination; and a control circuit for controlling a charge supply capacity of the charge supply circuit based on output signals of the plurality of potential detecting circuits such that the internal potential applied to each of the plurality of load capacitors is equal to the reference potential. Since the internal potentials are detected at the plurality of positions, the charges can be supplied more efficiently than the prior art, in which the internal potential is detected at only one position. Accordingly, the internal potential can be rapidly restored to the reference potential even when the internal potential changed.

Preferably, the charge supply circuit includes a clock generating circuit for generating a clock signal, and a plurality of charge pump circuits each configured to supply charges to one end of the potential transmission line in synchronization with the clock signal. Further, the control circuit operates based on the output signals of the plurality of potential detecting circuits to activate or deactivate each of the plurality of charge pump circuits. In this case, the charge supply capacity of the charge supply circuit can be easily controlled.

Preferably, the charge supply circuit includes a clock generating circuit for outputting a clock signal of a controllable frequency, and a charge pump circuit for supplying the charges to one end of the potential transmission line in synchronization with the output clock signal of the clock generating circuit. The control circuit can control the frequency of the output clock signal of the clock generating circuit based on the output signals of the plurality of potential detecting circuits. The charge supply capacity of the charge supply circuit can be easily controlled, similarly to the foregoing cases.

A semiconductor device of further another aspect of the invention includes a potential transmission line for transmitting an internal potential; a plurality of load capacitors dispersed along the potential transmission line, and each configured to receive the internal potential from the potential transmission line; a plurality of pads dispersed along the potential transmission line, and connected to the potential transmission line for monitoring the potential on the potential transmission line; a charge pump circuit for supplying charges to one end of the potential transmission line in synchronization with a clock signal; a potential detecting circuit for detecting whether the internal potential at a predetermined position on the potential transmission line has reached a reference potential or not, setting an activation signal to a first level if reached, and setting the activation signal to a second level if not reached; and a clock generating circuit being activated to issue the clock signal to the charge pump circuit when the activation signal is at the second level. Since the internal potentials are monitored at the plurality of positions, it can be easy to determine whether the supply of charges and the potential detection are performed in the optimum state or not, compared with the prior art, in which the internal potential is monitored at only one position.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment]

Figure 1:
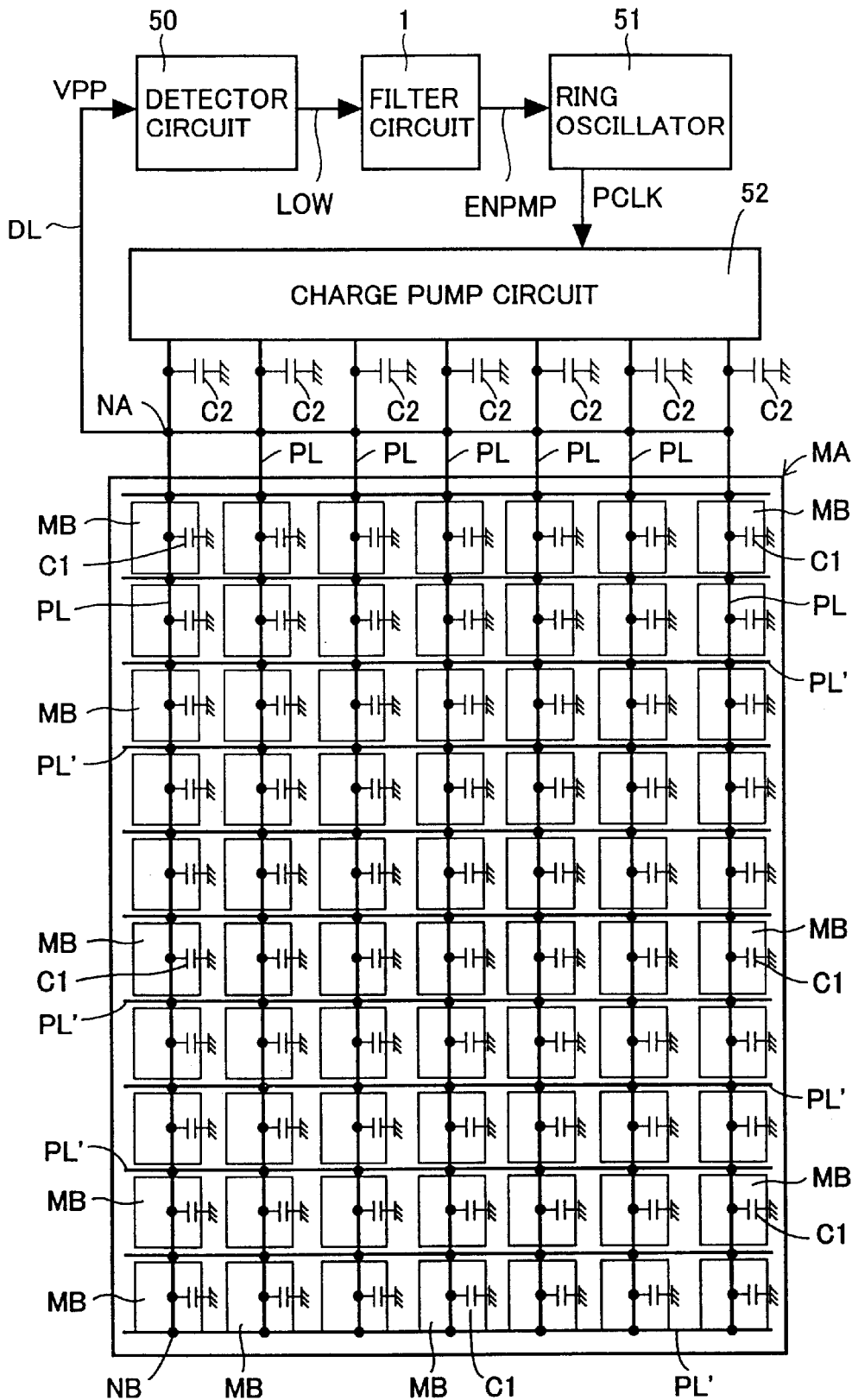
FIG. 1 is a circuit block diagram showing a major portion of a DRAM of a first embodiment of the invention.
Figure 15:
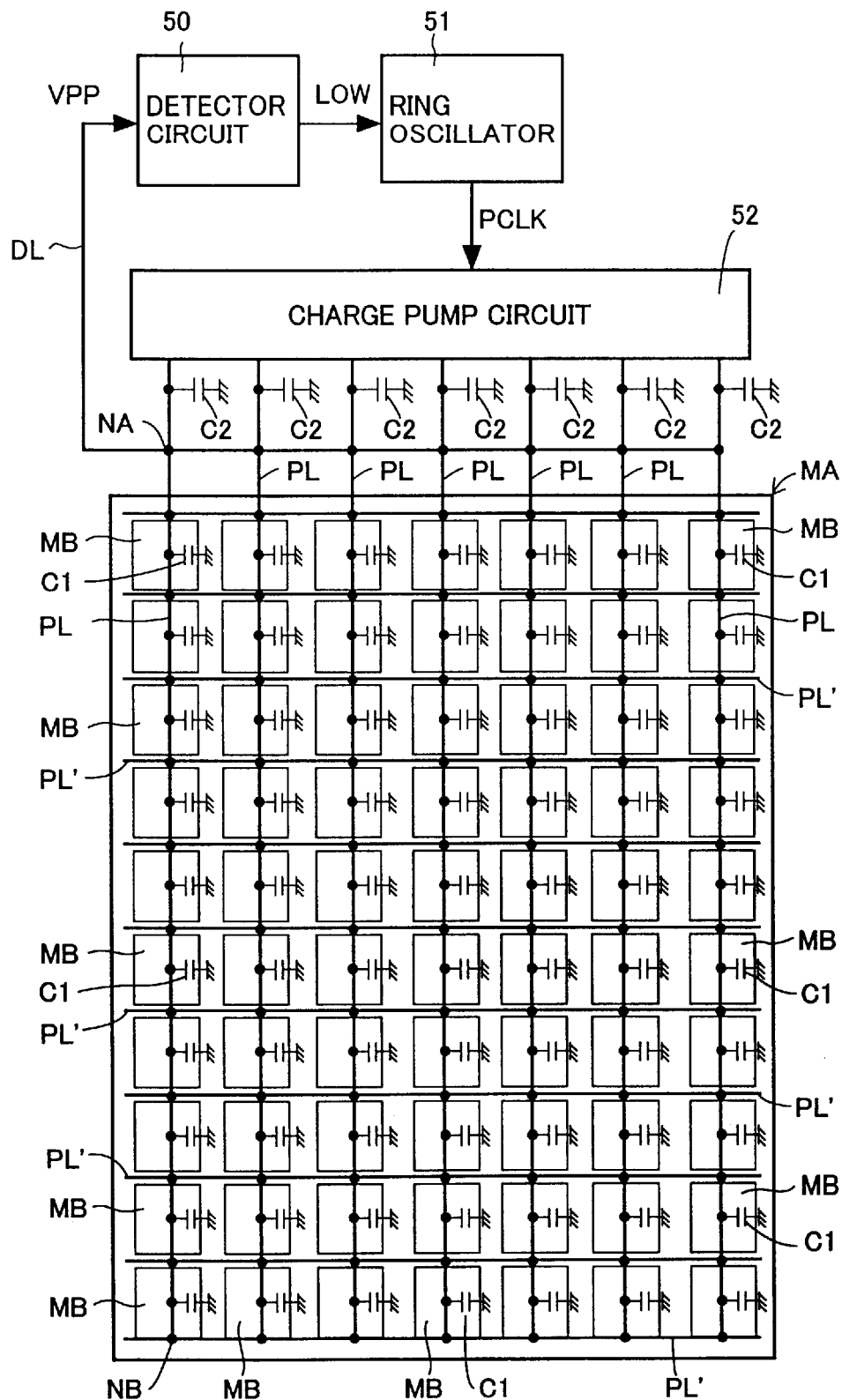
FIG. 15 is a circuit block diagram showing a major portion of a DRAM in the prior art.
Figure 16:
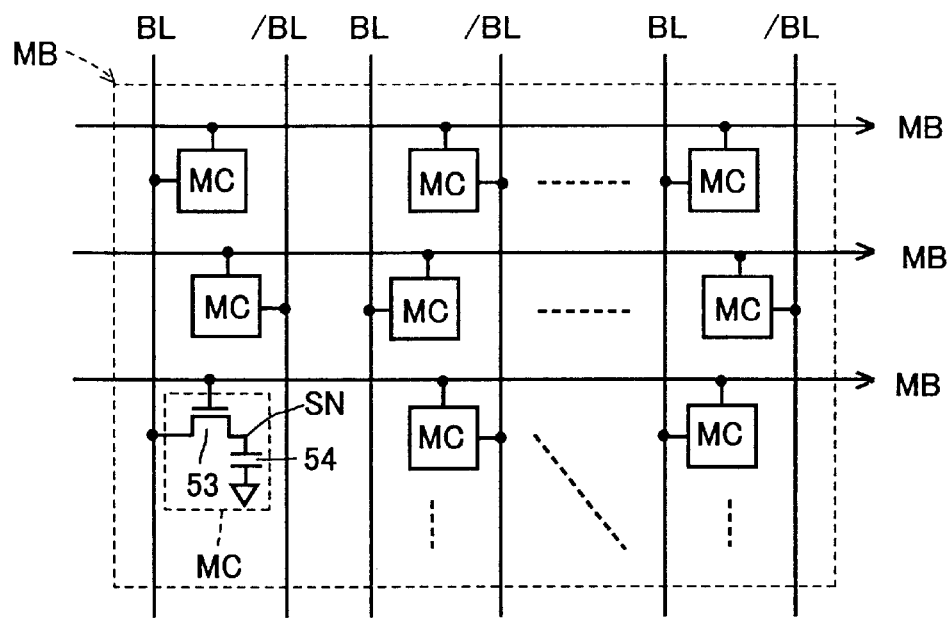
FIG. 16 is a circuit block diagram showing a structure of a memory block shown in FIG. 15.
Figure 17:
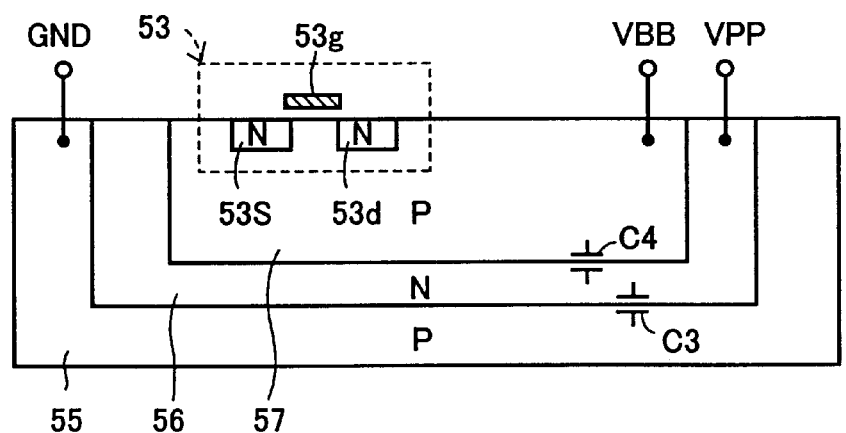
FIG. 17 is a cross section showing a schematic structure of the memory block shown in FIG. 16.
Figure 18:
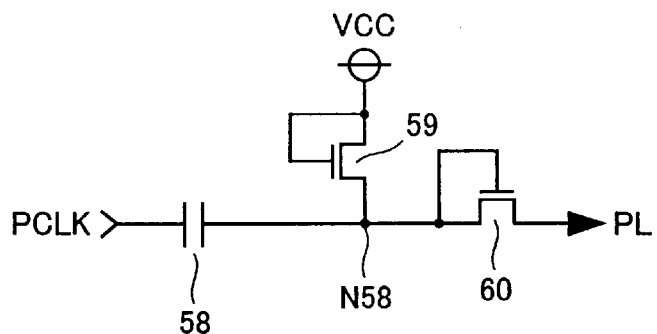
FIG. 18 is a circuit diagram showing a major portion of a charge pump circuit 52 shown in FIG. 15.

FIG. 1 is a circuit block diagram showing a major portion of a DRAM of a first embodiment of the invention, and corresponds to FIG. 15. Referring to FIG. 1, the DRAM differs from the conventional DRAM shown in FIG. 15 in that a filter circuit 1 is interposed between detector circuit 50 and ring oscillator 51.

Figure 2:
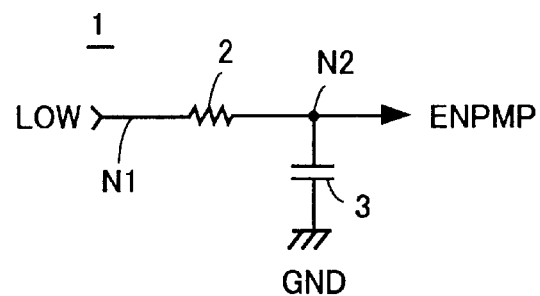
FIG. 2 is a circuit diagram showing a structure of a filter circuit shown in FIG. 1.

Filter circuit 1 includes, as shown in FIG. 2, a resistance element 2 connected between input and output nodes N1 and N2, and a capacitor 3 connected between output node N2 and a line bearing ground potential GND. Input node N1 receives output signal LOW of detector circuit 50, and a signal ENPMP appearing on output node N2 is applied to ring oscillator 51.

For example, when signal LOW falls to "L" level in such a state that both signals LOW and ENPMP are at "H" level, charges stored in capacitor 3 gradually flow out through resistance element 2 to input node N1 at "L" level. Therefore, signal ENPMP gradually lowers from "H" level. Accordingly, the level of signal ENPMP hardly changes even when signal LOW temporarily falls to "L" level in a pulse-like manner.

Figure 3:
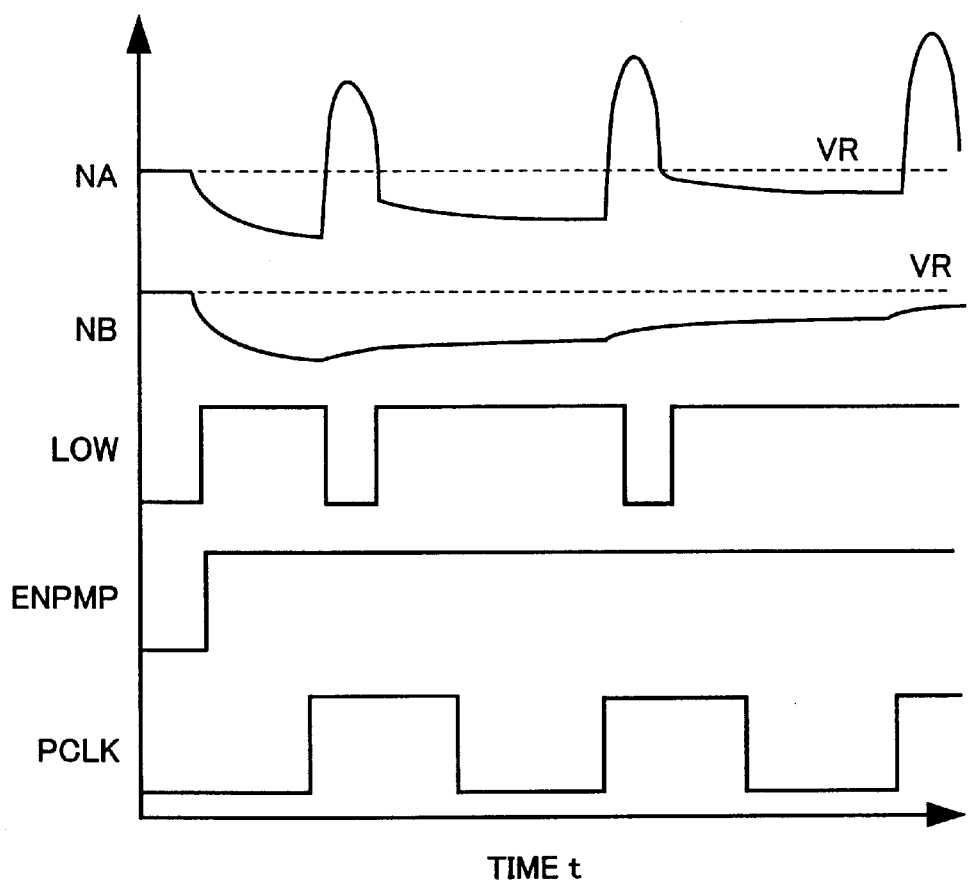
FIG. 3 is a time chart showing an operation of the DRAM shown in FIGS. 1 and 2.
Figure 19:
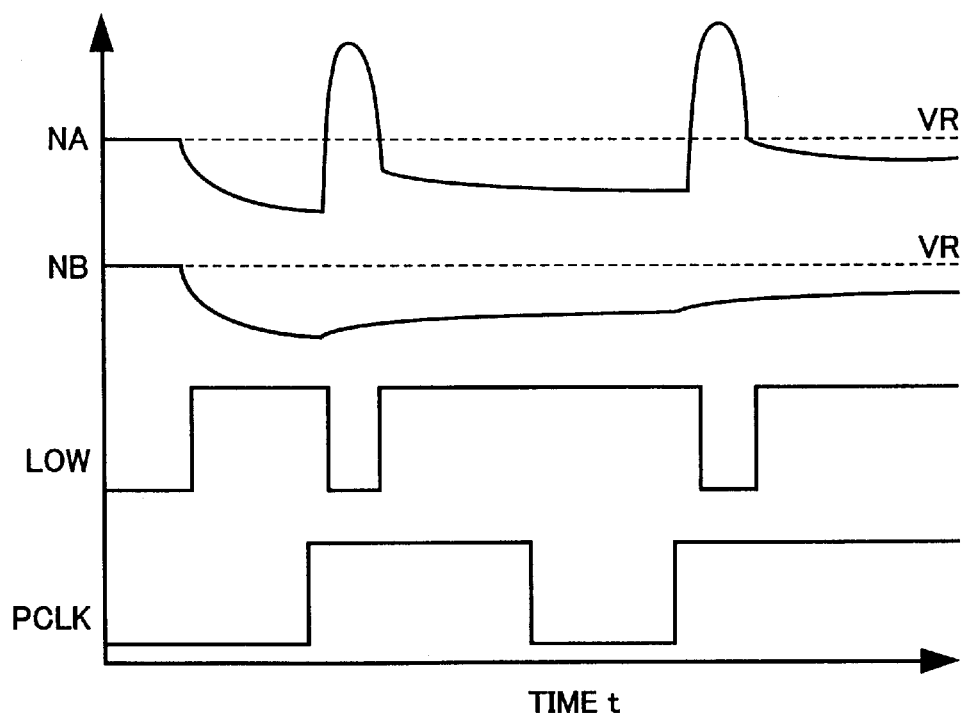
FIG. 19 is a time chart showing an operation of the DRAM shown in FIGS. 15 to 18.

FIG. 3 is a time chart showing an operation of the DRAM shown in FIGS. 1 and 2, and corresponds to FIG. 19. When boosted potential VPP on a base end (node NA) of a power supply line PL consuming a boosted potential VPP becomes lower than reference potential VR in memory array MA, output signal LOW of detector circuit 50 rises to "H" level. In response to this, output signal ENPMP of filter circuit 1 rises to "H" level so that ring oscillator 51 is activated to produce clock signal PCLK. When clock signal PCLK rises from "L" level to "H" level, a pulse-like change exceeding reference potential VR occurs in potential VPP on node NA, and signal LOW falls to "L" level in a pulse-like manner.

In a conventional DRAM, when signal LOW attains "L" level, ring oscillator 51 is deactivated to stop production of clock signal PCLK. According to the DRAM of the first embodiment, even when signal LOW lowers to "L" level in a pulse-like manner, output signal ENPMP of filter 1 does not change from "H" level so that ring oscillator 51 is not deactivated, and continues the production of clock signal PCLK. Accordingly, boosted potential VPP can be rapidly restored to reference potential VR.

Figure 4:
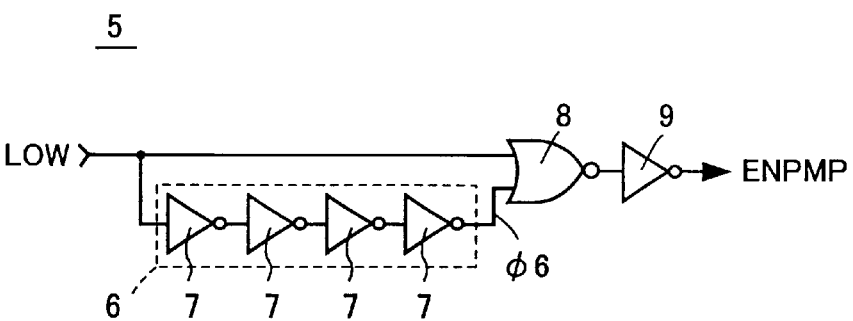
FIG. 4 is a circuit diagram showing a modification of the first embodiment.

Description will now be given on a modification of the first embodiment of the invention. In the modification of FIG. 4, a filter circuit 5 is employed instead of filter circuit 1. Filter circuit 5 includes a delay circuit 6 including an even number of (four in the figure) inverters 7, which are connected together in series, an NOR gate 8 and an inverter 9. Signal LOW is directly supplied to one of input nodes of NOR gate 8, and is supplied to the other input node of NOR gate 8 via a delay circuit 6. Inverter 9 inverts the output signal of NOR gate 8 to produce signal ENPMP.

For example, signal LOW may fall to "L" level in the state where both signals LOW and ENPMP are at "H" level. Even in this case, an output signal □6 of delay circuit 6 does not change from "H" level for a delay time of delay circuit 6, and signal ENPMP does not change from "H" level for the delay time thereof. Thus, signal ENPMP does not change from "H" level even if signal LOW falls in a pulse-like manner to "L" level. This modification can achieve the same effect as the first embodiment.

Figure 5:
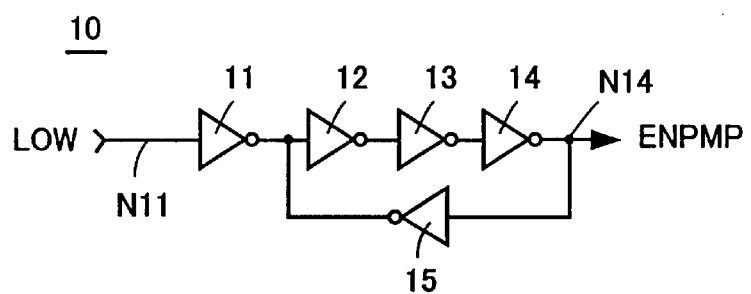
FIG. 5 is a circuit diagram showing another modification of the first embodiment.

In a modification of FIG. 5, a filter circuit 10 is employed instead of filter circuit 1. Filter circuit 10 includes an even number (four in FIG. 5) of inverters 11–14, which are connected in series between an input node N11 and an output node N14, and an inverter 15 connected in inverse-parallel with inverters 12–14.

In the state where both signals LOW and ENPMP are at "H" level, signal LOW may fall to "L" level. Even in this case, signal ENPMP will not change from "H" level for a delay time of inverters 11–14, and an output signal of inverter 15 will not change from "L" level. Thus, signal ENPMP does not change from "H" level even if signal LOW lowers in a pulse-like manner to "L" level. This modification can likewise achieve the same effect as the first embodiment.

[Second Embodiment]

Figure 6:
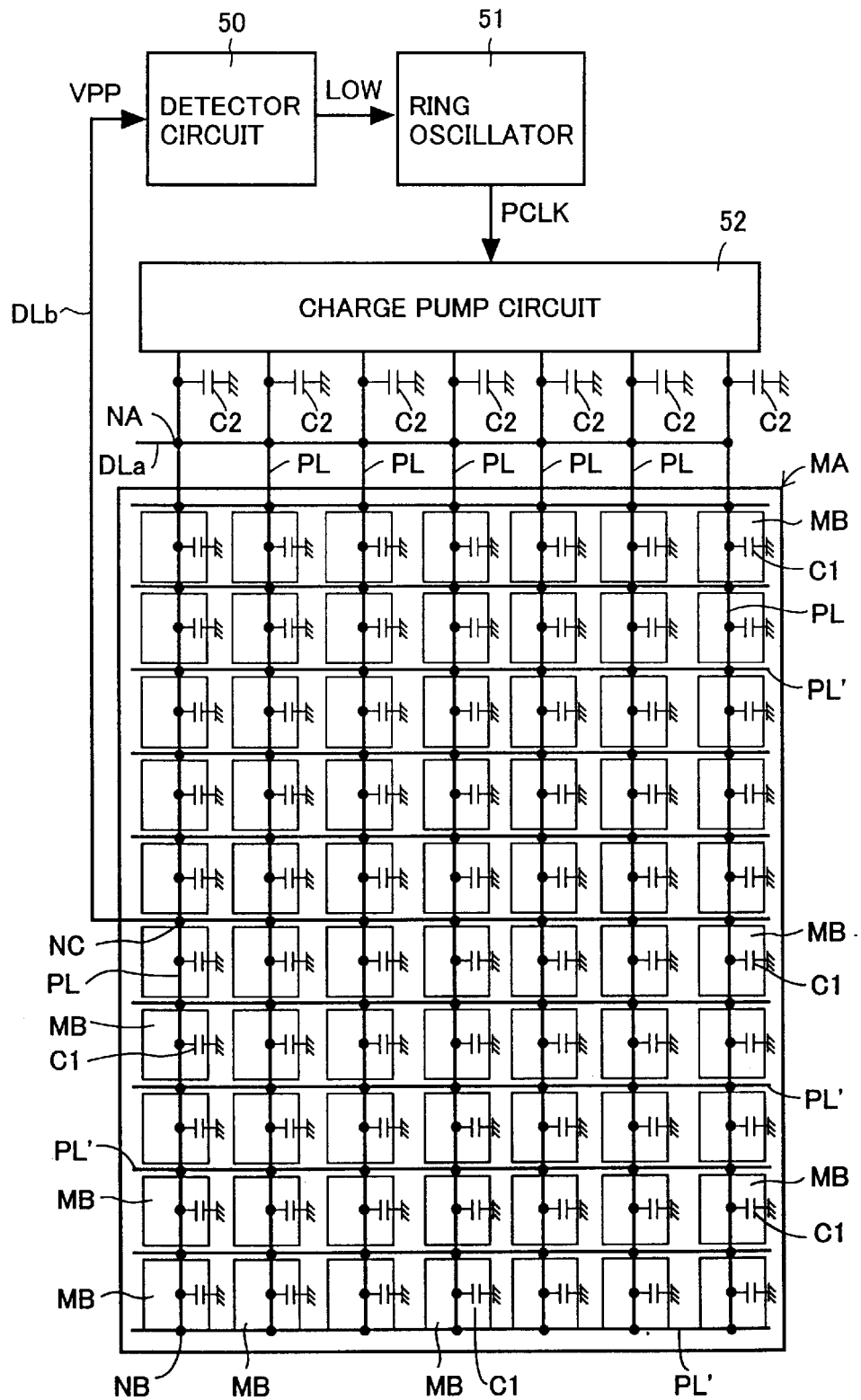
FIG. 6 is a circuit block diagram showing a major portion of a DRAM of a second embodiment of the invention.

FIG. 6 is a circuit block diagram showing a major portion of a DRAM of a second embodiment of the invention, and corresponds to FIG. 15. Referring to FIG. 6, the DRAM differs from the DRAM shown in FIG. 15 in that potential detecting line DL is cut at a position near node NA to leave only a portion DLa, which short-circuits the seven output nodes of charge pump circuit 52, and a potential detecting line DLb is connected between one end (a node NC) of a power supply line PL', which is located between memory blocks MB in the fifth and sixth positions, and detector circuit 50. The line resistance of potential detecting line DLb is much smaller than the line resistances of power supply lines PL and PL'.

Figure 7:
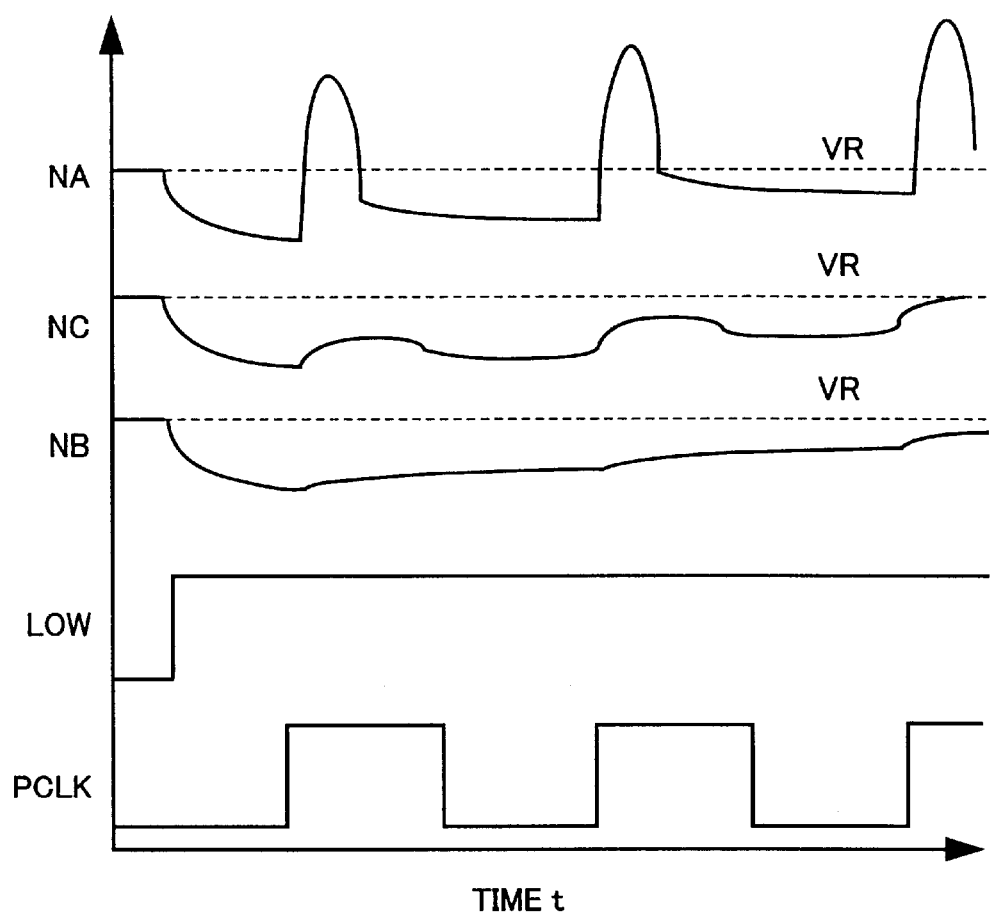
FIG. 7 is a time chart showing an operation of the DRAM shown in FIG. 6.

FIG. 7 is a time chart showing an operation of a DRAM shown in FIG. 6, and corresponds to FIG. 19. In FIG. 7, a pulse-like change occurs in boosted potential VPP on the base end (node NA) of power supply line PL in response to the rising edge of clock signal PCLK. However, on the middle portion (node NC) and the other end (node NB) of power supply line PL, the boosted potential VPP does not change in the pulse-like manner, but changes slowly owing to the line resistance of power supply line PL and bottom well capacitor C1.

In the second embodiment, since boosted potential VPP on the middle portion (node NC) of power supply line PL is led to detector circuit 50, output signal LOW of detector circuit 52 does not change in a pulse-like manner so that ring oscillator 51 does not stop. Accordingly, boosted potential VPP can be rapidly restored to reference potential VR.

[Third Embodiment]

In recent years, a system LSI including a DRAM and a logic circuit, which are mounted on a single chip, has been developed. In system LSI, memory array MA of the DRAM has a size, which is variable depending on the intended use.

As the size of memory array MA changes, a ratio between capacitance values of decouple capacitor C2 and bottom well capacitor C1 of memory array MA changes, and the peak level of boosted potential VPP changes. In this third embodiment, therefore, boosted potential VPP can be detected at a position, which is variable depending on the size of memory array MA.

Figure 8:
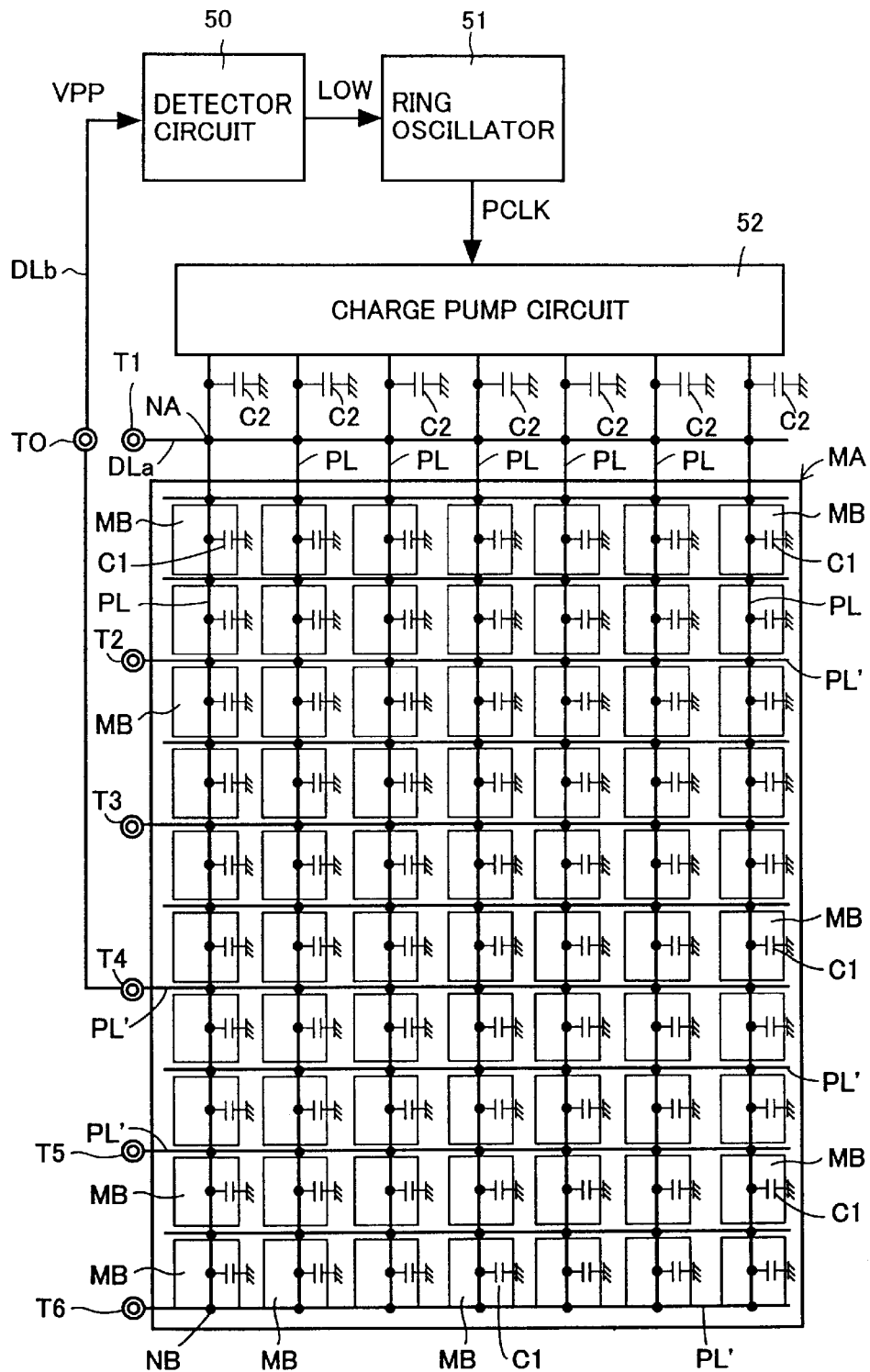
FIG. 8 is a circuit block diagram showing a major portion of a DRAM of a third embodiment of the invention.

FIG. 8 is a circuit block diagram showing a major portion of a DRAM of a third embodiment of the invention, and corresponds to FIG. 6. Referring to FIG. 8, the DRAM differs from the DRAM in FIG. 6 in that potential detecting line DLb is cut at a position near node NA to leave a portion between the position near node NA and detector circuit 50, that potential detecting lines DLb and DLa as well as power supply lines PL', which are located under, in FIG. 8, the 2nd, 4th, 6th, 8th and 10th memory blocks MB, are provided with terminals T0–T6 each located on one end of the corresponding line, respectively, and that a potential detecting line DLc is connected between the selected one (T4 in FIG. 8) of terminals T1–T6 and terminal T0.

The size of memory array MA can be changed in steps of two rows of memory blocks MB, e.g., by changing a mask. For example, the mask can be changed for selecting, from terminals T1–T6, the terminal to be connected to terminal T0 via potential detecting line DLc. In FIG. 8, potential detecting line DLc connects terminals T0 and T4 together so that an effect similar to that shown in FIG. 7 can be achieved.

Figure 9:
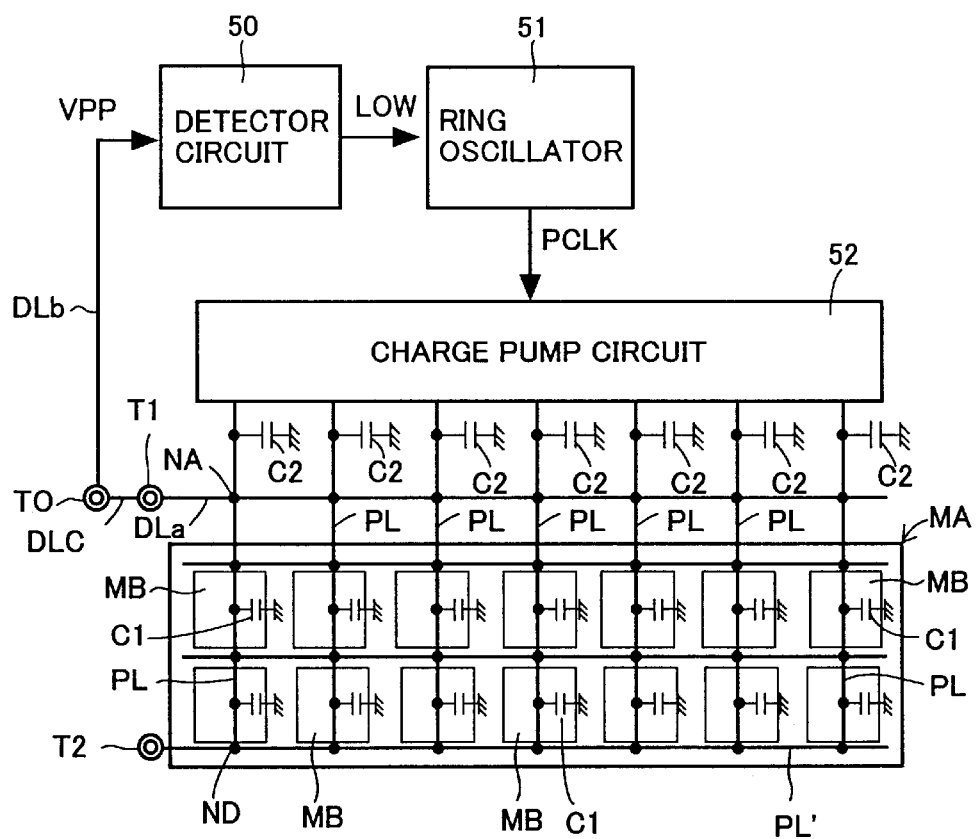
FIG. 9 is a circuit block diagram showing a method of using the DRAM shown in FIG. 8.
Figure 10:
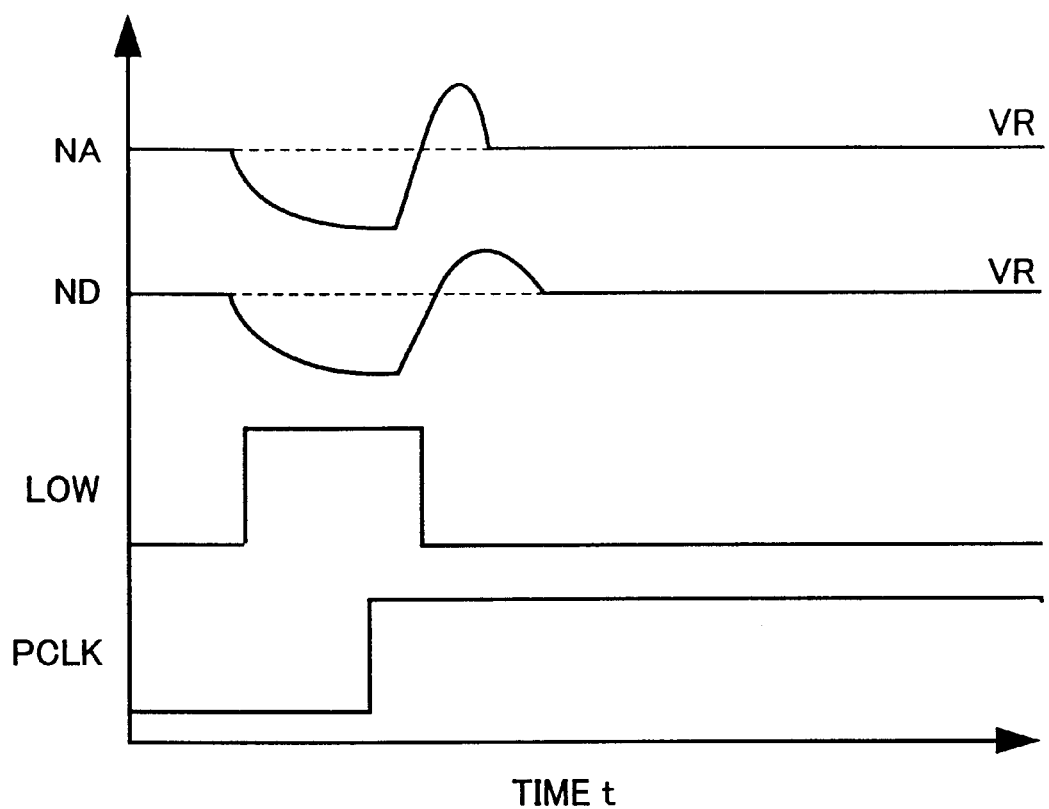
FIG. 10 is a time chart showing an operation of the DRAM shown in FIG. 9.

FIG. 9 shows a structure, in which memory array MA is formed of two rows of memory blocks MB. In this case, a ratio of bottom well capacitor C1 of memory array MA with respect to decouple capacitor C2 is small so that a difference in waveform hardly occurs between the based node (node NA) and the other end (node ND) of power supply line PL, as shown in FIG. 10. In the DRAM of FIG. 9, therefore, potential detecting line DLc connects terminal T0 to terminal T1 for further quick response of detector circuit 50 with respect to the potential change in boosted potential VPP.

In the third embodiment, boosted potential VPP at the desired position, which depends on the size of memory array MA, is led to detector circuit 50. Therefore, the charges can be efficiently supplied in accordance with the change in level of boosted potential VPP, and boosted potential VPP can be rapidly restored to reference potential VR even when boosted potential VPP changed.

[Fourth Embodiment]

Figure 11:
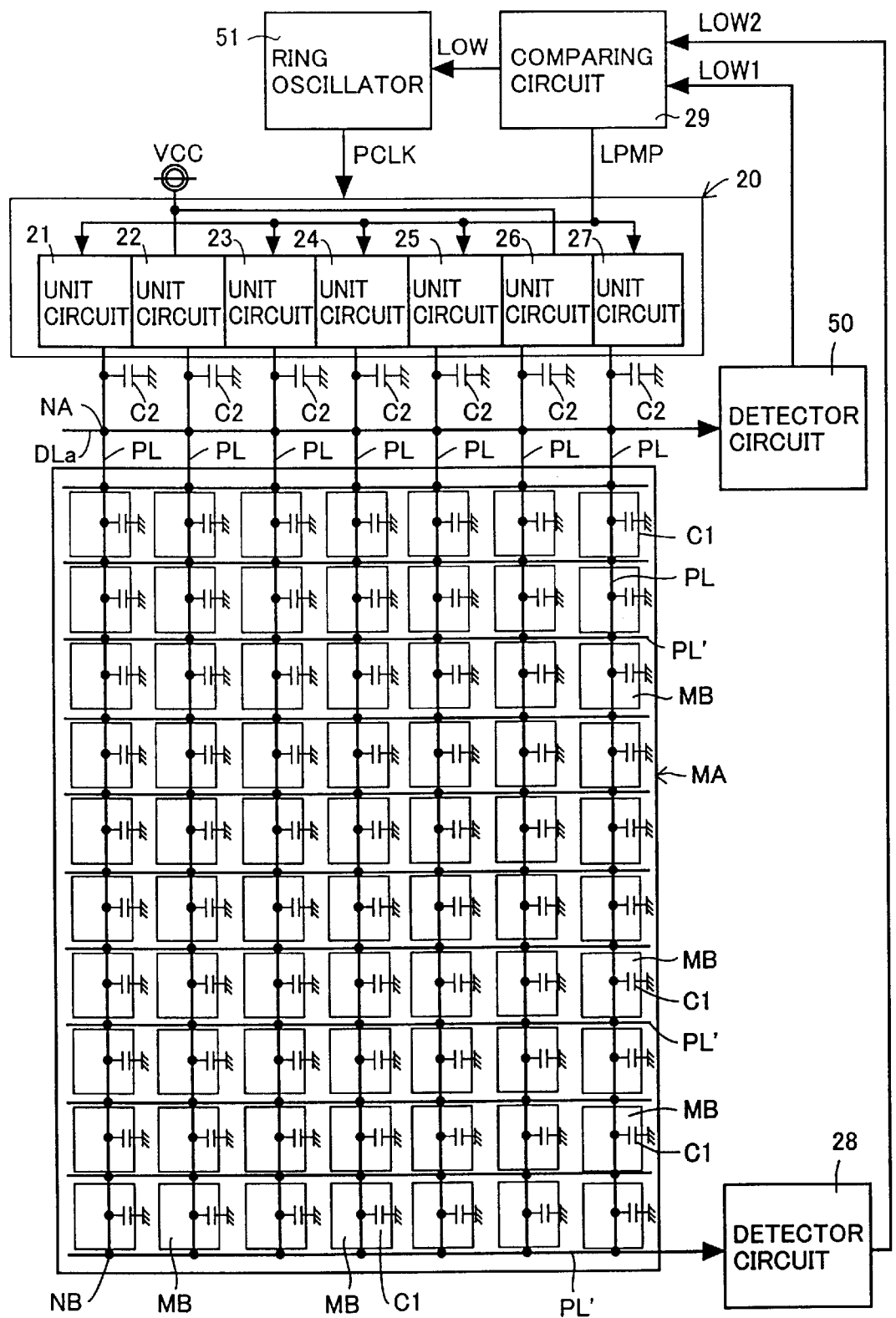
FIG. 11 is a circuit block diagram showing a major portion of a DRAM of a fourth embodiment of the invention.

FIG. 11 is a circuit block diagram showing a major portion of a DRAM of a fourth embodiment of the invention, and corresponds to FIG. 15. Referring to FIG. 11, the DRAM differs from the DRAM in FIG. 15 in that charge pump circuit 52 is replaced with a charge pump circuit 20, and a detector circuit 28 and a comparing circuit 29 are additionally employed.

Charge pump circuit 20 includes seven unit circuits 21–27 corresponding to seven power supply lines PL, respectively. Two unit circuits 23 and 26 among seven unit circuits 21–27 are always active. Other five unit circuits 21, 23–25 and 27 are active when an output signal LPMP of comparing circuit 29 is at the active level of "H", and are inactive when signal LPMP is at the inactive level of "L". Each of unit circuits 21–27 in the active state applies a predetermined amount of positive charges to corresponding power supply line PL in response to each rising edge of output clock signal PCLK.

Detector circuit 28 sets a signal LOW2 to the active level of "H" when potential VPP on the distal end (node NB) of power supply line PL is lower than reference potential VR, and sets signal LOW2 to the inactive level of "L" when potential VPP on node NB is higher than reference potential VR.

Comparison circuit 29 sets signal LOW, which is used for activation/deactivation of ring oscillator 51, to "H" or "L" level based on output signals LOW1 and LOW2 of detector circuits 50 and 28, and also sets signal LPMP, which is used for activation/deactivation of unit circuits 21, 23–25 and 27 of charge pump circuit 20, to "H" or "L" level based on output signals LOW1 and LOW2.

As shown in a Table 1, comparing circuit 29 sets both signals LOW and LPMP to "H" level to activate all unit circuits 21–27, and thereby increases the pump capacity when both signals LOW1 and LOW2 are at "H" level, because memory array MA is entirely in such a state that boosted potential VPP is lower than reference potential VR.

TABLE 1

| LOW1 | LOW2 | LOW | LPMP | Pump Capacity |
|---|---|---|---|---|
| H | H | H | H | high |
| L | H | H | L | low |
| L | L | L | L | pump stop |

When signals LOW1 and LOW2 are at "L" and "H" levels, respectively, only a portion of memory array MA is in such a state that boosted potential VPP is lower than reference potential VR. In this state, therefore, comparing circuit 29 sets signals LOW and LPMP to "H" and "L" levels, respectively, and activates only two unit circuits for decreasing the pump capacity.

When signals LOW1 and LOW2 are both at "L" level, memory array MA is entirely in such a state that boosted potential VPP is higher than reference potential VR. In this case, therefore, comparing circuit 29 sets both signals LOW and LPMP to "L" level, and stops all charge pump unit circuits 21–27 for stopping supply of charges.

In this fourth embodiment, the charge supply capacity of charge pump circuit 20 is controlled based on the potentials on both the base end (node NA) and the distal end (node NB) of power supply line PL. Therefore, boosted potential VPP can be efficiently controlled, and boosted potential VPP can be rapidly restored to reference potential VR even when boosted potential VPP changed.

[Fifth Embodiment]

Figure 12:
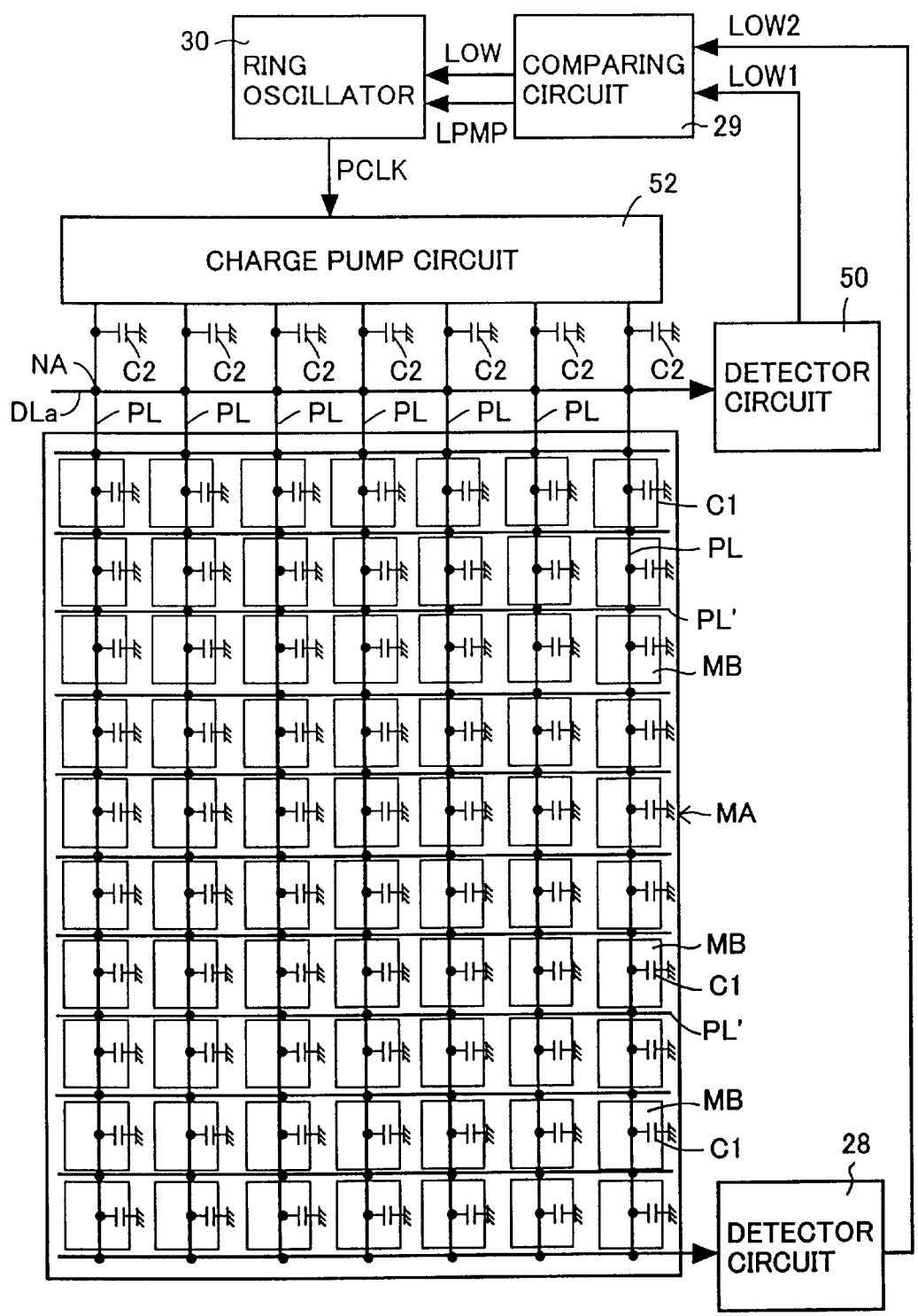
FIG. 12 is a circuit block diagram showing a major portion of a DRAM of a fifth embodiment of the invention.

FIG. 12 is a circuit block diagram showing a major portion of a DRAM of a fifth embodiment of the invention, and corresponds to FIG. 11. Referring to FIG. 12, the DRAM differs from the DRAM in FIG. 11 in that a ring oscillator 30 and charge pump 52 are used instead of ring storage capacity 51 and charge pump 20, respectively.

Figure 13:
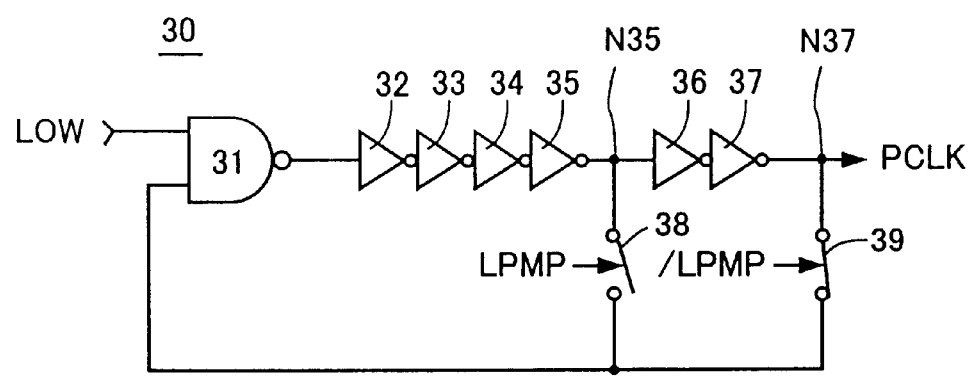
FIG. 13 is a circuit diagram showing a structure of a ring oscillator shown in FIG. 12.

Ring oscillator 30 includes a NAND gate 31, inverters 32–37 and switches 38 and 39, as shown in FIG. 13. Signal LOW is supplied to one of input nodes of NAND gate 31. Inverters 32–37 are connected in series between the output node of NAND gate 31 and an output node N37 of ring oscillator 30. Switch 38 is connected between an output node N35 of inverter 35 and the other input node of NAND gate 31, and is kept on while signal LPMP is at "H" level. Switch 39 is connected between output node N37 and the other input node of NAND gate 31, and is kept on while signal LPMP is at "L" level.

When signal LOW is at the inactive level of "L", the output node of NAND gate 31 is fixed to "H" level, and ring oscillator 30 is deactivated. When signal LOW is at the active level of "H", NAND gate 31 operates as an inverter, and ring oscillator 30 is active.

When signal LPMP is at "H" level, switch 38 is on, and switch is off so that NAND gate 31, inverters 32–35 and switch 38 form a closed loop, and a clock signal PCLK of a relatively high frequency is produced.

When signal LPMP is at "L" level, switch 39 is on, and switch 38 is off so that NAND gate 31, inverters 32–37 and switch 39 form a closed loop, and clock signal PCLK of a relatively low frequency is produced.

As shown in a Table 2, comparing circuit 29 sets both signals LOW and LPMP to "H" level to increase the frequency of clock signal PCLK, and thereby increases the pump capacity when both signals LOW1 and LOW2 are at "H" level, because memory array MA is entirely in such a state that boosted potential VPP is lower than reference potential VR.

TABLE 2

| LOW1 | LOW2 | LOW | LPMP | Pump Capacity (ring oscillator frequency) |
|---|---|---|---|---|
| H | H | H | H | high |
| L | H | H | L | low |
| L | L | L | L | pump stop |

When signals LOW1 and LOW2 are at "L" and "H" levels, respectively, only a portion of memory array MA is in such a state that boosted potential VPP is lower than reference potential VR. In this state, therefore, comparing circuit 29 sets signals LOW and LPMP to "H" and "L" levels, respectively, and lowers the frequency of clock signal PCLK to decrease the pump capacity.

When both signals LOW1 and LOW2 are at "L" level, memory array MA is entirely in such a state that boosted potential VPP is higher than reference potential VR. In this case, therefore, comparing circuit 29 sets both signals LOW and LPMP to "L" level, and stops production of clock signal PCLK for stopping supply of charges.

The fifth embodiment can achieve the same effect as the fourth embodiment.

[Sixth embodiment]

Figure 14:
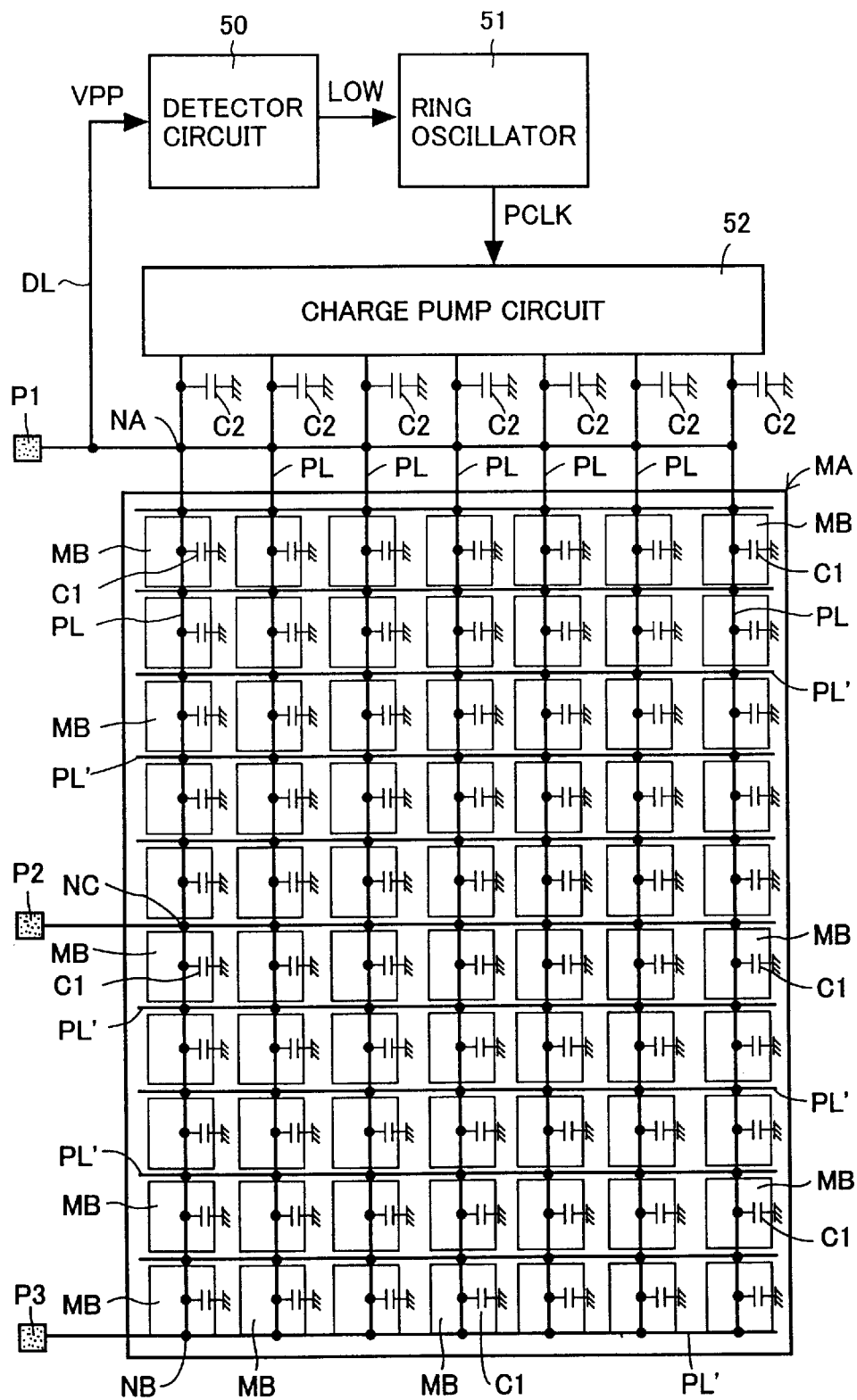
FIG. 14 is a circuit block diagram showing a major portion of a DRAM of a sixth embodiment of the invention.

FIG. 14 is a circuit block diagram showing a major portion of a DRAM of a sixth embodiment of the invention, and corresponds to FIG. 15. Referring to FIG. 14, the DRAM differs from the DRAM in FIG. 15 in that a plurality of (three in FIG. 15) pads P1–P3 are additionally employed for monitoring boosted potential VPP. Pad P1 is connected to the base end (node NA) of power supply line PL. Pad P2 is connected to a middle portion (node NC) of power supply line PL. Pad P3 is connected to the distal end (node NB) of power supply line PL. In the monitoring operation, a probe of a potential detector is brought into contact with the pad.

In this sixth embodiment, boosted potential VPP can be monitored at a plurality of points on memory array MA. Therefore, it is easy to determine in whole memory array MA whether the boosted potential VPP is kept at reference potential VR or not.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a potential transmission line for transmitting an internal potential;
   a plurality of load capacitors dispersed along said potential transmission line, and each configured to receive said internal potential from said potential transmission line;
   a charge pump circuit for supplying charges to one end of said potential transmission line in synchronization with a clock signal;
   a potential detecting circuit for determining whether said internal potential at a predetermined position on said potential transmission line has reached a reference potential or not, setting an activation signal to a first level if reached, and setting the activation signal to a second level if not reached;
   a filter circuit for removing a pulse-like change in level from said activation signal; and
   a clock generating circuit being activated to issue said clock signal to said charge pump circuit when the activation signal processed by said filter circuit is at said second level.

2. A semiconductor device comprising:
   a potential transmission line for transmitting an internal potential;
   a plurality of load capacitors dispersed along said potential transmission line, and each configured to receive said internal potential from said potential transmission line;
   a charge pump circuit for supplying charges to one end of said potential transmission line in synchronization with a clock signal;
   a potential detecting circuit for detecting whether said internal potential at a predetermined position between two connection nodes formed between the load capacitors on the opposite ends among said plurality of load capacitors and said potential transmission line has reached a reference potential or not, setting an activation signal to a first level if reached, and setting the activation signal to a second level if not reached; and
   a clock generating circuit being activated to issue said clock signal to said charge pump circuit when said activation signal is at said second level.

3. The semiconductor device according to claim 2, further comprising:
   a potential detecting line for applying said internal potential at said predetermined position on said potential transmission line to said potential detecting circuit.

4. A semiconductor device comprising:
   a potential transmission line for transmitting an internal potential;
   a plurality of load capacitors dispersed along said potential transmission line, and each configured to receive said internal potential from said potential transmission line;
   a charge supply circuit for supplying charges to one end of said potential transmission line;
   a plurality of potential detecting circuits dispersed along said potential transmission line, each receiving said internal potential from said potential transmission line to determine whether said internal potential has reached a reference potential or not, and each issuing a signal at a level corresponding to the result of the determination; and
   a control circuit for controlling a charge supply capacity of said charge supply circuit based on output signals of said plurality of potential detecting circuits such that the internal potential applied to each of said plurality of load capacitors is equal to said reference potential.

5. The semiconductor device according to claim 4, wherein
   said charge supply circuit includes:
      a clock generating circuit for generating a clock signal, and
      a plurality of charge pump circuits each configured to supply charges to one end of said potential transmission line in synchronization with said clock signal; and said control circuit operates based on the output signals of said plurality of potential detecting circuits to activate or deactivate each of said plurality of charge pump circuits.

6. The semiconductor device according to claim 4, wherein said charge supply circuit includes:

a clock generating circuit for outputting a clock signal of a controllable frequency, and a charge pump circuit for supplying the charges to one end of said potential transmission line in synchronization with the output clock signal of said clock generating circuit; and said control circuit controls the frequency of the output clock signal of said clock generating circuit based on the output signals of said plurality of potential detecting circuits.

* * * * *